United States Patent [19]

Shipley

[11] 4,169,732

[45] Oct. 2, 1979

[54] PHOTOSENSITIVE COATING COMPOSITION AND USE THEREOF

[75] Inventor: John F. Shipley, Endicott, N.Y.

[73] Assignee: International Business Machines Corporation, Armonk, N.Y.

[21] Appl. No.: 867,996

[22] Filed: Jan. 9, 1978

[51] Int. Cl.$^2$ .......................... G03C 5/16; B05D 3/06; B32B 27/38
[52] U.S. Cl. ..................................... 96/35.1; 96/36.2; 96/67; 96/115 R; 204/159.15; 427/54; 427/96; 427/154; 427/155; 427/156; 428/413; 428/417; 428/418
[58] Field of Search .................. 260/837 R, 830 TW; 427/155, 54, 96, 154, 156; 96/36.2, 35.1, 115 R, 67; 204/159.15; 428/413, 417, 418, 147

[56] References Cited

U.S. PATENT DOCUMENTS

| | | | |
|---|---|---|---|
| 2,892,712 | 6/1959 | Plambeck, Jr. | 96/35 |
| 3,301,743 | 1/1967 | Fekete et al. | 260/836 X |
| 3,936,557 | 2/1976 | Watt | 427/54 X |
| 3,989,610 | 11/1976 | Tsukada et al. | 204/159.15 |

*Primary Examiner*—Michael F. Esposito
*Assistant Examiner*—Thurman K. Page
*Attorney, Agent, or Firm*—Pollock Vande Sande & Priddy

[57] ABSTRACT

A photosensitive coating composition comprising reaction products of a monoethylenically unsaturated carboxylic acid and two different epoxy polymers; a polyethylenically unsaturated compound; and photoinitiator; and method of employing the same.

29 Claims, No Drawings

4,169,732

PHOTOSENSITIVE COATING COMPOSITION AND USE THEREOF

FIELD OF THE INVENTION

The present invention is concerned with a photosensitive epoxy polymer coating composition and method for employing the same as a negative resist. The photosensitive compositions of the present invention include pre-reaction productions of two different epoxy polymers with monoethylenically unsaturated carboxylic acid.

BACKGROUND OF THE INVENTION

Certain epoxy compositions have been suggested as photosensitive resists. For example, the use of certain reaction products of a monoethylenically unsaturated acid and certain epoxides for the manufacture of patterned articles such as printed electronic circuits has been suggested in U.S. Pat. No. 3,661,576 to Crary and abandoned U.S. patent application Ser. No. 613,784 entitled "Photo-Processable Coatings" to Schmidt et al and Assigned to the Assignee of the Instant Application. Furthermore, photosensitive composition based on epoxide resins which have not been pre-reacted with a monoethylenically unsaturated acid but which must include certain specific types of sensitizers have been suggested for use in preparing selective or patterned coatings. An example of such prior art is U.S. Pat. No. 3,930,856 to DeMoira.

Also, various coating compositions containing monoethylenically unsaturated acid-epoxy adducts have been suggested for coating operations, which do not involve the problems of resolution experienced in the use of a composition as a photosensitive resist in the manufacture of patterned articles such as printed circuits. Exemplary of such disclosures are U.S. Pat. No. 3,912,670 to Huemmer et al; U.S. Pat. No. 3,772,062 to Shur et al; U.S. Pat. No. 3,450,613 to Steinberg et al and U.S. Pat. No. 4,003,877 to Lipson, et al.

Providing coating compositions which exhibit acceptable imaging (resolution and acuity) characteristics to be suitable as an image or pattern mask particularly for integrated circuits along with the necessary physical characteristics to provide a permanent protective coating is quite difficult. In particular, compositions suitable as a patterned protective coating for a circuit board must possess a number of different types of properties. In many instances, according to the specific use and/or environment of use, and depending upon priorities, a balancing of properties becomes necessary. In particular, a satisfactory level of one property is achieved by a reduction in the performance of another property. In many coatings, for instance film forming properties are sacrificed in order to obtain satisfactory resolution and acuity, and likewise, acuity has been sacrificed, when possible, to achieve desirable film forming characteristics.

In the manufacture of printed circuit boards, it is desirable that the polymeric material used be patternable by means of a photolytic process, as is the practice with photoresist, and which also, unlike photoresist, can be retained to perform one or more additional functional uses during or after fabrication of the circuit board. In view of the unique combination of good properties obtainable by the products of the present invention, such functions, for example, use as a permanently retained etch mask, solder mask, plating mask, dielectric film or protective coating are possible.

According to the present invention, it has been found that a particular combination of reaction products of a monoethylenically unsaturated carboxylic acid with two different epoxides in combination with the other constituents of the composition provide photo-processable coatings which not only exhibit good resolution (e.g.—sharply defined acuity), but also possess excellent film forming properties such as good flexibility and toughness. Moreover, it has been noted that the loss of film of the cured portion during the development when practicing the present invention is much less than when using other photoprocessable epoxy coatings including those disclosed in abandoned U.S. patent application Ser. No. 613,784 referred to hereinabove.

A further advantage of the present invention, is that the compositions can be made non-tacky. Accordingly, such can be applied in a process which employs the following steps:

(a) Coating the material onto a carrier film such as an inexpensive polyethylene carrier;

(b) Laminating the film and carrier to a circuit board;

(c) Removing the carrier; and (d) Then exposing and developing the coating composition.

On the other hand, the commercially available photoresist compositions which are applied utilizing a carrier in accordance with the process shown in the examples of U.S. Pat. No. 3,469,982 to Celeste are not generally suitable for such a process. For instance, the commercially available photoresists employ an expensive transparent carrier (e.g.—Mylar) and the photoresist is exposed through the carrier. The general commercially available photoresists are somewhat tacky and accordingly the carrier cannot be separated from it prior to the exposure since portions would stick to the exposure mask. If the carrier were removed portions, would be removed along with the carrier.

An advantage of being able to successfully remove the carrier before the exposure step is that exposing through the carrier as shown in the examples of U.S. Pat. No. 3,469,982 causes some degradation of the image.

It is believed that generally the commercially available photoresists include a relatively large amount of liquid cross-linking agent; whereas, the compositions of the present invention can be prepared with only relatively minor amounts of a polyethylenically cross-linking agent since the majority of cross-linking can occur through the chain molecules themselves.

SUMMARY OF INVENTION

The composition aspect of the present invention is concerned with a photo-processable patternable coating composition which comprises:

(a) reaction product of monoethylenically unsaturated carboxylic acid and a bisphenol A—diglycidyl ether epoxide

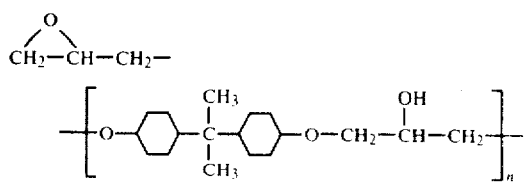

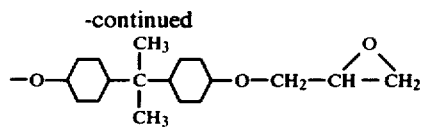

(b) reaction product of a monoethylenically unsaturated carboxylic acid and an epoxidized novolac of the formula:

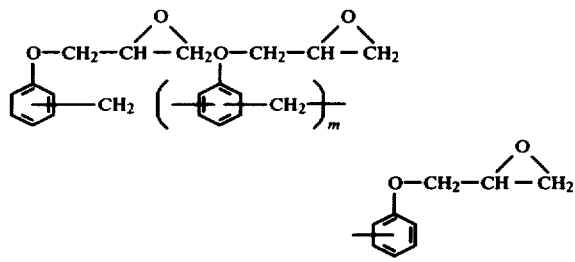

(c) The ratio of a:b is from about 1:4 to about 4:1;
(d) polyethylenically unsaturated compound; and
(e) photo-initiator.

One method by which the compositions can be employed as a negative resist image includes exposing a film of the coating composition described hereinabove to ultraviolet light in a predetermined pattern; continuing the exposure until substantial curing of the film is achieved in the exposed areas; and then removing the unexposed portions of the film.

Another method in which the compositions of the present invention can be employed to produce a negative resist image comprises coating a carrier film with a photo-processable patternable coating composition as described hereinabove; laminating the film and carrier to a circuit board with the film being adjacent the circuit board; removing the carrier while leaving the film intact; exposing the film to an ultraviolet light in a predetermined pattern; continuing the exposure until substantial curing of the film is achieved in the exposed areas and then removing the unexposed portions of the film.

DESCRIPTION OF PREFERRED EMBODIMENTS

According to the present invention, a combination of reaction products of an α, β ethylenically unsaturated carboxylic acid with two different epoxy polymers is employed. With respect to the α, β ethylenically unsaturated carboxylic acid, such are well-known and readily available commercially. Exemplary of such acids are acrylic acid, methacrylic acid and crotonic acid. The most preferred ethylenically unsaturated carboxylic acid employed according to the present invention is acrylic acid.

One of the epoxy polymers pre-reacted with the ethylenically unsaturated carboxylic acid is a bisphenol A-diglycidyl ether such as a bisphenol A-epichlorohydrin epoxy polymer.

The epoxide has the general formula:

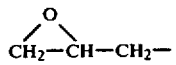

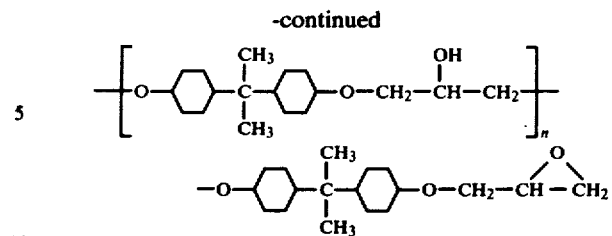

It can be liquid or solid depending upon the molecular weight which generally ranges from about $3 \times 10^2$ to about $10 \times 10^4$. The n in the above formula generally varies from about 0.2 to about 100, and preferably from about 0.2 to about 25, and most preferably up to about 10. Mixtures of epoxy polymers of the above formula with different molecular weights can be employed when desired. For instance, it may be desirable to include minor amounts of relatively high molecular weight epoxy polymers (e.g. n=about 10–100) in combination with lower molecular weight epoxy polymers (e.g.—n=0.2–10) to enhance film formation or when laminating to a carrier film without sacrificing to any significant degree the very excellent photosensitivity achieved with the most preferred lower molecular weight epoxy polymers.

The main requirements of this epoxy is that its reaction product with the acid be film forming. The relative amounts of monoethylenically unsaturated acid to the diglycidyl ether—bisphenol A epoxide usually employed in the present invention is sufficient to react stoichiometrically with about 25 to about 100 percent, and preferably about 25 to about 75 percent of the epoxide functionality of this epoxy. The most preferred amount is about 75 percent. The higher the amount of acid, the better the toughness of the film and the sharper the image.

The other epoxy polymer employed is an epoxidized novolac of the formula:

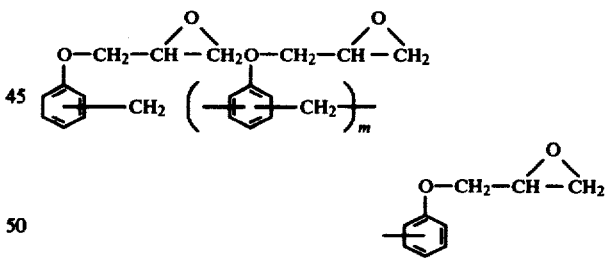

This epoxy polymer can be a liquid, semi-solid, or solid depending upon its molecular weight. Epoxy polymers wherein m is 1.5 to 3.5 are commercially available and are generally suitable for purposes of the present invention. Mixtures of epoxy polymers of the above formula with different molecular weights can be employed when desired.

The relative amount of the monoethylenically unsaturated acid to the epoxidized novolac polymer is such as to react stoichiometrically with from about 25 to about 100 percent of the epoxide functionality of the novolac resin and preferably with about 25 to 75 percent of the epoxide functionality. The most preferred amount is about 75 percent. The higher the relative amount of acid, the better the film properties and imaging properties.

The reaction products are believed to be addition products formed by the following:

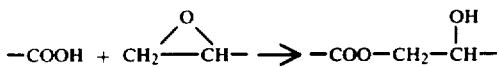

The relative amounts between the two epoxy constituents is from about 1:4 to about 4:1, preferably is about 1:3 to about 3:1 and most preferably is about 1:1. Relative amounts outside of the desired ranges do not provide the unique combination of good properties achieved by the present invention. For instance, when the epoxidized novolac was employed in amounts greater than 4:1, gellation of the composition occurred which was detrimental to ease of coating and to the subsequent development of the desired pattern. Furthermore, use of epoxides different from those specified resulted in inferior compositions. For instance, an octafunctional resin [EPI-REZ SU 8] of the formula:

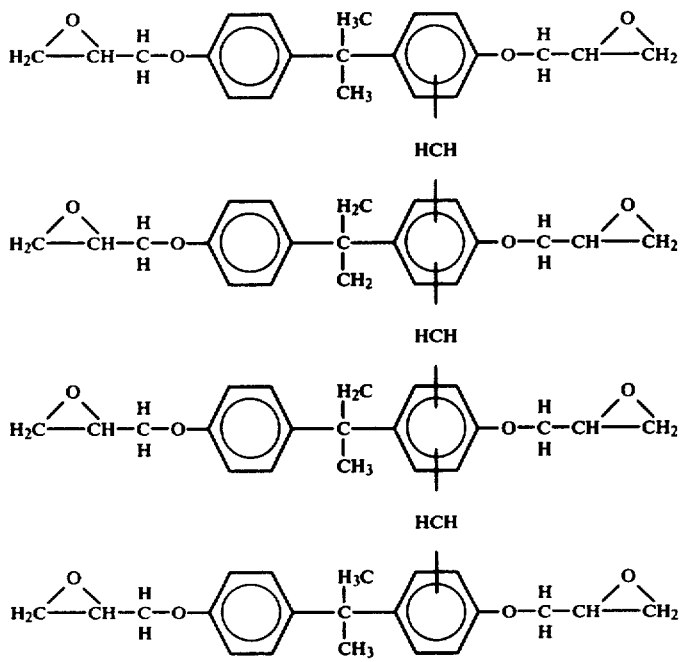

pre-reacted with acrylic acid was employed in place of the epoxidized novolac but did not provide sufficiently good film properties; although, the image and pattern producing effects were quite good.

The relative amounts of the combination of epoxides in the composition are generally from about 20 to about 75 percent.

The pre-reaction conditions are well known and need not be described herein in any great detail. For instance, temperatures of about normal room temperature to about 75° C. are suitable. Times of pre-reaction of 30 minutes and up have been found quite adequate.

When using a relativley low molecular epoxy polymer of the bisphenol A—epichlorohydrin type and when the composition is to be laminated to a carrier, it may be desirable to include a minor amount of a relatively high molecular polymer of the same type (e.g.—up to about 10% of the total epoxy component) or another relatively high molecular weight polymer (e.g.—up to about 10% of weight of total epoxy constituent) to assist in providing increased smoothness of the final film, such as a phenoxy polymer of the formula:

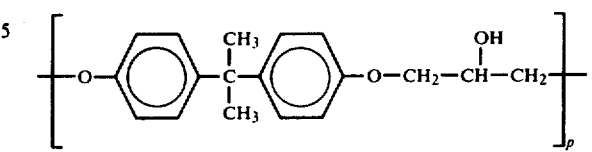

wherein p is usually about 25 to about 100. Some commercially available phenoxypolmers include Eponol 53, Eponol 55, and Epon 1009.

The polyethylenically unsaturated compounds employed in the compositions of the present invention must be capable of reacting upon exposure to ultraviolet light and should contain terminal ethylenic groups. Such compounds include unsaturated esters of polyols and especially esters of the methylene carboxylic acid such as ethylene diacrylate; diethylene glycol diacrylate; glycerol diacrylate; glycerol triacrylate; ethylene dimethacrylate; 1,3-propylene dimethacrylate; 1,2,4-butene triol trimethacrylate; 1,4-benzenediol dimethacrylate; pentaerythritol tetramethacrylate; 1,3-propane diol diacrylate; 1,6-hexane diol diacrylate; the bis-acrylates and methacrylates of polyethylene glycols of molecular weight 200–500; trimethylol propane triacrylate; pentaerythritol triacrylate; unsaturated amides such as those of the methylene carboxylic acids and especially those of alpha, omega-diamines and oxygen-interrupted omega-diamines such as methylene bisacryl and bismethacrylamide; diethylene triamine tris-methacrylamide; bis-(methacrylamidopropoxy) ethane; bis-methacrylamidoethyl methacrylate N-[($\beta$-hydroxyethyloxy) ethyl] acrylamide; vinyl-esters such as divinyl succinate; divinyl adipate; divinyl phthalate, divinyl terephthalate, divinyl benzene-1,3-disulfonate, and divinyl butane-1,4-disulfonate; and unsaturated aldehydes such as sorbaldehyde.

The preferred polyethylenically unsaturated compounds include the polyethylene glycoldiacrylates and trimethylol porpane triacrylate. The relative amount of the polyethylenically unsaturated compound employed according to the present invention is from about 0.5 percent to about 40 percent and preferably from about 1 percent to about 20 percent.

The compositions of the present invention further include a photo-initiator or sensitizer. Many such materials are well known to the prior art. Examples of some suitable photo-initiators include anthraquinone and substituted anthraquinones such as the alkyl substituted or halo substituted anthraquinones including 2-tert-butylanthraquinone, 1-chloroanthraquinone; p-chloroanthraquinone, 2-methylanthraquinone, 2-ethylanthraquinone and octamethylanthraquinone; other substituted or unsubstituted polynuclear quinones including 1,4-naphthoquinone, 9,10-phenanthraquinone, 1,2-benzanthraquinone, 2,3-benzanthraquinone, 2-methyl-1,4-naphthoquinone, 2,3-dichloronaphthoquinone, 1,4-dimethylanthraquinone, 2,3-dimethylanthraquinone, 2-phenylanthraquinone, 2,3-diphenylanthraquinone, 3-chloro-2-methylanthraquinone, retenequinone, 7,8,9,10-tetrahydronaphthacenequinone, 1,2,3,4-tetrahydrobenzantracene-7,12-dione. Other photo-sensitizers include halogen-type sensitizers such as carbontetrachloride, bromoform and carbontribromide; benzotriazole; benzoin, chloranil, benzil, diacetyl, 5-nitrosalicylaldehyde, 2,4-dinitrotoluene. Mixtures of photo-initiators can be employed when desired. The preferred photo-initiators include the anthraquinones such as tert.-butyl anthraquinone. The photoinitiator is employed in amounts sufficient to sensitize the composition to ultraviolet light and is generally from about 0.1 to about 10 percent and preferably from about 0.1 to about 5 percent. In a preferred embodiment from about 0.1 to 5 percent t.-butylanthraquinone is employed.

In addition, the compositions, when desired, can include an organic non-reactive diluent to facilitate the coating operation. Examples of suitable solvents include cellosolve acetate, methyl carbitol, butyl carbitol, methylene chloride, and ketones such as methyl ethyl ketone. When employed, the diluent is present in an amount sufficient to provide compositions having a viscosity between about 100 and about 1700 centistokes.

The compositions of the present invention can be prepared by first obtaining a solution of the two different epoxy polymers and then adding the monocarboxylic acid along with a promoter such as a primary, secondary or tertiary amine including benzyldimethylamine, triethylamine, and triethanolamine; or a metal salt such as stannous octoate and ferrous octoate to promote reaction of the carboxylic acid group of the acid with the terminal epoxy groups of the epoxide polymer.

After admixture of the acid and epoxy, the other ingredients, the polyethylenically unsaturated compound, and the photo-initiators are generally added to the composition. In addition, if additional diluents are desired to reduce the viscosity of the composition such can conveniently be added at this stage. When a relatively high molecular weight polymer such as the epichlorohydrin-bisphenol A type of epoxy or phenoxy is employed in addition to the two required epoxy polymers, such can be added prior to and/or subsequent to reaction with the carboxylic acid.

Next, the composition is coated onto the desired substrate to the desired thickness. Usually not more than about 10 mils and preferably not more than about 5 mils is adequate for preparing printed circuits with about 2 mils being a convenient minimum amount. The photoresist can be coated onto a carrier film or onto the desired circuit board depending upon the intended process to be used.

The carrier films must be capable of being stripped or releasable from the composition without damaging the integrity of the film formed and should be flexible enough so that it can be wound up for convenience. Suitable carrier films include polyethylene, polypropylene, polyesters such as polyethyleneterephthalate (e.g.—Mylar), wax paper, paper containing a release coating such as a silicone. When the composition is to be exposed to the radiation prior to removal of the supporting film, then the supporting film must be a relatively expensive transparent film such as polyethyleneterephthalate. On the other hand, when the supporting film is to be removed prior to exposure, then the film need not be transparent and can be relatively inexpensive such as polyethylene or polypropylene sheeting.

The film is then exposed to ultraviolet light radiation through an image-bearing transparency of the desired pattern. The exposure to the ultraviolet light causes the polymer composition to cross-link thereby rendering it insoluble.

After exposure to the ultraviolet light and after removal of any supporting films (if employed), the coating is developed by removing areas not struck by ultraviolet light. This can be accomplished by immersing or spraying the film with a suitable solvent. Some suitable solvents include methylcarbitol, butylcarbitol, butyl cellosolve acetate, cellosolve acetate, and diethylene glycol monoethylether. The solvent selected is one which will dissolve the uncured polymer composition without attacking to any undesired extent the cured composition. Suitable solvents can be readily determined by persons skilled in the art once they are aware of the present application without undue experimentation.

Moreover, when desired, the film can be post-cured by subjecting the film to elevated temperatures such as about 100° to about 180° C. for about ½ to about 10 hours. In addition, to facilitate the post-curing, if desired an additional hardening agent can be diffused into the freshly developed film from a suitable solvent. The hardening agent may be selected from any one of a large number used to give epoxy resins particular properties. The amount of hardener diffused into the film is governed by the concentration and immergant time in the hardener solution. The use of additives which are normally used in epoxy technology can generally be employed with photo-processable coatings of this invention. Obviously, additives which drastically interfere with either the light absorption of the coating or with the photoresist must be avoided. When additives are used it would be preferable to add them after the pre-reaction product of the acid and epoxy has been prepared in order to avoid any possible deleterious interactions with the reaction mechanisms.

Substrates over which the photo-processable coating is spread may be any metal, plastic, glass or any other material over which epoxy materials are normally spread. The range of light exposure, time and intensity for a typical photo-processable coating may be ascertained from the following typical conditions:

30 inches from a high pressure short arc mercury lamp manufactured by OSRAM GMBH, Germany Model HBO, 500 watts for a period of about 2 minutes to about 20 minutes.

Since the films obtained according to the present invention can be visably clear, the film thickness has very little, if any, effect upon the exposure time added.

The following examples serve to illustrate preferred embodiments of this invention and are not intended to limit the teachings as set forth herein.

EXAMPLE 1

To a 50 percent solution containing about 700 parts by weight of cellosolve acetate and about 700 parts by weight of an epichlorohydrin-bisphenol A epoxy resin (Epon resin 1004) and a 50 percent solution of about 700 parts by weight of cellosolve acetate and a solid epoxy novolac resin (Dow XD 7855) was added about 250 parts by weight of acrylic acid and about 14 parts by weight of benzyl dimethylamine as a promoter. The mixture is allowed to react at about 65° C. for about 20 hours. Next, a premix of about 82 parts by weight of polyethylene diacrylate, and about 41.25 parts by weight of tert-butyl anthraquinone and about 244 parts of cellosolve acetate.

The composition is coated onto one side of a polyethyleneterephthalate sheet (mylar) to a thickness of about 3 mils and passed through an oven maintained at about 285° F. at a speed of about 10 feet/minute.

The coated sheet is laminated to a printed circuit board such as a copper clad substrate by heating between about 50° and 120° C. The polyethyleneterephthalate is peeled from the coating composition just prior to exposure leaving the coating intact on the circuit board. The coating is exposed through a step wedge 30 inches from the 500 watt lamp described hereinabove. Exposure time of about 3 minutes is more than adequate for producing an acceptable image upon development. The composition is developed by spraying with butyl carbitol.

The composition after exposure is post-cured at about 160° C. for about 2 hours.

Excellent photo images with sharp edges and excellent resolution were obtained from the above coating. These results have been repeatable with using different lots of the above epoxy polymers. Moreover, the cured composition can withstand normal wave solder processes with both low melt solder and tin lead eutectic at 500° F.

EXAMPLE 2

To a 50 percent solution containing about 700 parts by weight of cellosolve acetate and about 700 parts by weight of an epichlorohydrin-bisphenol A epoxy resin (Epon resin 1004) and a 50 percent solution of about 700 parts by weight of cellosolve acetate and a solid epoxy novolac resin (Dow XD 7855) was added about 250 parts by weight of acrylic acid and about 14 parts by weight of benzyl dimethylamine as a promoter. The mixture is allowed to react at about 65° C. for about 20 hours. Next, a premix of about 82 by weight of polyethylene diacrylate, about 41.25 parts by weight of tert-butyl anthraquinone and about 32.58 parts by weight of a silicone obtained from Dow and being an alkyl substitute cyclic silsequioxane mixed with toluene.

The composition is sprayed onto a printed circuit board such as a copper clad substrate and is heated for about 105 minutes at 60° C., leaving a film of about 3 mils thick. The coating is exposed through a step wedge 30 inches from the 500 watt lamp described hereinabove. Exposure time of about 3 minutes is more than adequate for producing an acceptable image upon development. The composition is developed by spraying with butyl cellosolve acetate. The composition is post-cured at about 160° C. for about 2 hours. The results are similar to those of Example 1.

EXAMPLE 3

Example 1 is repeated except that about 16.5 parts of carbon tetrabromide is also employed. The results obtained are similar to those of Example 1.

EXAMPLE 4

Example 1 is repeated employing a composition obtained from about 26 percent by weight of Epon resin 1004, about 26 percent by weight of Dow XD 7855; about 9.3 percent by weight of acrylic acid; about 0.5 percent by weight of benzyl dimethylamine; about 30 percent by weight of cellosolve acetate; about 0.5 percent by weight of benzotriazole, and about 1.3 percent by weight of tert. butyl anthraquinone. The results obtained are similar to those from Example 1.

EXAMPLE 5

Example 1 is repeated except that about 16.5 parts of benzotriazole are also employed. The results obtained are similar to those of Example 1.

The above compositions provide unique combinations of properties which include the excellent image forming capability (good resolution and ability to accurately follow a pattern), along with excellent film forming properties such as good adhesion, flexibility, and good coating properties such as flowability initially when coated. The above properties are believed to be due to the special combination and relative amounts of epoxy-acid adducts in combination with the other components. Although mixtures of epoxy resins per se have been used in coating compositions such as suggested in U.S. Pat. Nos. 3,930,856, 3,936,557, 3,752,669, and 3,826,650, such disclosures do not suggest the particular mixture of epoxy-acrylic adducts required by the present invention nor give any indication that mixtures would provide the necessary unique combination of properties as achieved by the present invention.

What is claimed is:

1. A photo-processable patternable coating composition consisting essentially of:

(a) reaction product of monoethylenically unsaturated carboxylic acid and a bisphenol A-diglycidyl ether epoxide of the formula:

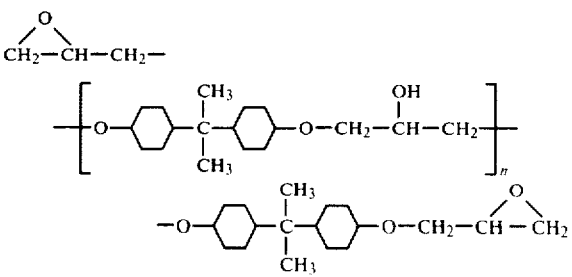

(b) reaction product of monoethylenically unsaturated carboxylic acid and an epoxidized novolac of the formula:

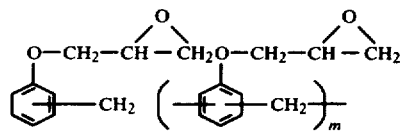

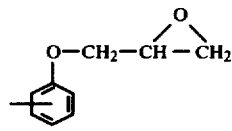

(c) the ratio of a:b is from about 1:4 to about 4:1;
(d) polyethylenically unsaturated compound;
(e) photo-initiator; and
(f) wherein the relative amount of said acid to each of said epoxides is sufficient to react stoichiometrically with about 20 to about 100 percent of the epoxide functionality of said epoxides.

2. The composition of claim 1 wherein the ratio of a:b is about 1:1.

3. The composition of claim 1 wherein n is about 0.2 to about 100 and m is about 1.5 to about 3.5.

4. The composition of claim 1 wherein said carboxylic acid is selected from the group consisting of acrylic acid, methacrylic acid, crotonic acid, and mixtures thereof.

5. A substrate coated with the composition of claim 1 wherein said substrate is releasable from said composition without damaging the integrity of film formed from said composition.

6. The composition of claim 1 wherein the relative amounts of said acid to both of said epoxides is sufficient to react stoichiometrically with about 25 to about 75 percent of the epoxide functionality of said epoxides.

7. The composition of claim 1 wherein the combination of said epoxides is from about 20 to about 75 percent by weight of the total composition.

8. The composition of claim 1 wherein said polyethylenically unsaturated compound is an ester of a polyol.

9. The composition of claim 1 wherein said polyethylenically unsaturated compound is polyethylene glycol diacrylate.

10. The composition of claim 1 wherein said polyethylenically unsaturated compound is trimethylol propane triacrylate.

11. The composition of claim 1 wherein the relative amount of said polyethylenically unsaturated compound is from 0.5 to about 40 percent by weight of said composition.

12. The composition of claim 1 wherein said polyethylenically unsaturated compound is from 1 to about 20 percent by weight of said composition.

13. The composition of claim 1 which further includes an organic nonreactive diluent.

14. The composition of claim 1 which further includes a diluent in an amount sufficient to provide compositions having a viscosity between about 100 and about 1700 centistokes.

15. The composition of claim 1 which further includes a diluent selected from the group consisting of cellosolve acetate, methylcarbitol, butylcarbital, methylene chloride and methylethyl ketone.

16. The composition of claim 1 wherein the ratio of a:b is about 3:1 to about 1:3.

17. The composition of claim 1 wherein n is about 0.2 to about 25.

18. The composition of claim 1 wherein n is 0.2 to about 10.

19. The composition of claim 1 which includes up to about 10 percent by weight based upon the total of a and b of a bisphenol A - epichlorohydrin epoxy wherein n is about 10 to about 100.

20. The composition of claim 1 which includes up to about 10 percent by weight based upon the total of a and b of a phenoxy polymer.

21. A substrate coated with the composition of claim 1.

22. A method for the production of a negative resist image comprising the steps of:
(a) exposing a film to ultraviolet light in a predetermined pattern wherein said film consists essentially of:
(1) reaction product of monoethylenically unsaturated carboxylic acid and a bisphenol A-diglycidyl ether epoxide;
(2) reaction product of monoethylenically unsaturated carboxylic acid and an epoxidized novolac of the formula:

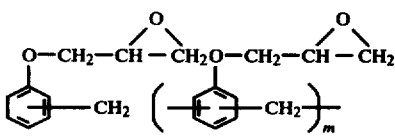

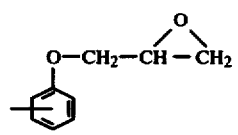

2 (3) the ratio of (1):(2) is from about 1:4 to about 4:1;
(4) polyethylenically unsaturated compound;
(5) photo-initiator; and
(6) wherein the relative amount of said acid to each of said epoxides is sufficient to react stoichiometrically with about 20 to about 100 percent of the epoxide functionality of said epoxides;
(b) continuing the exposure until substantial curing of the film is achieved in the exposed areas and removing the unexposed portions of the film.

23. The method of claim 22 which further includes post-curing the coating by subjecting it to elevated temperatures after removing the unexposed portions of the film.

24. The method of claim 22 wherein the post-curing is conducted at about 100 to about 180° C. for about 0.5 to about 10 hours.

25. A method for the production of a negative resist image comprising the steps of:
(a) coating a carrier film with a photo-processable patternable composition consisting essentially of:
(1) reaction product of monoethylenically unsaturated carboxylic acid and a bisphenol A-diglycidyl ether epoxide;
(2) reaction product of monoethylenically unsaturated carboxylic acid and an epoxidized novolac of the formula:

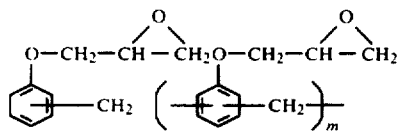

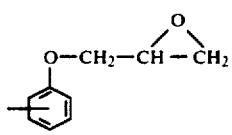

(3) the ratio of (1):(2) is from about 1:4 to about 4:1;
(4) polyethylenically unsaturated compound;
(5) photo-initiator; and wherein the relative amount of said acid to each of said epoxides is sufficient to react stoichiometrically with about 20 to about 100 percent of the epoxide functionality of said epoxide;

(b) laminating the film and carrier to a circuit board with the film being adjacent the circuit board;
(c) removing said carrier while leaving the film intact;
(d) exposing said film to ultraviolet light in a predetermined pattern;
(e) continuing the exposure until substantial curing of the film is achieved in the exposed areas and removing the unexposed portions of the film.

26. The method of claim 25 wherein said carrier is removed prior to exposing the film to ultraviolet light.

27. The method of claim 25 wherein said carrier is removed after exposing the film to ultraviolet light.

28. The composition of claim 1 wherein the ratio of a:b is about 1:1; n is about 1.5 to about 3.5; said carboxylic acid is acrylic acid; and wherein said polyethylenically unsaturated compound is polyethylene glycol diacrylate or triacylate.

29. A substrate coated with the composition of claim 1 to a thickness of about 2 mils to about 10 mils.

* * * * *